United States Patent [19]

Momma et al.

[11] 4,266,990

[45] May 12, 1981

[54] PROCESS FOR DIFFUSION OF ALUMINUM INTO A SEMICONDUCTOR

[75] Inventors: Naohiro Momma, Hitachi; Hiroyuki Taniguchi, Kodaira, both of Japan

[73] Assignee: Hitachi, Ltd., Tokyo, Japan

[21] Appl. No.: 88,136

[22] Filed: Oct. 25, 1979

[51] Int. Cl.$^3$ .......................................... H01L 21/223
[52] U.S. Cl. ..................................... 148/189; 148/186; 148/187; 252/950; 252/951
[58] Field of Search ............... 148/187, 186, 189, 188; 252/950, 951

[56] References Cited

U.S. PATENT DOCUMENTS

| | | | |
|---|---|---|---|
| 3,143,444 | 8/1964 | Lowe et al. | 148/188 |
| 3,834,349 | 9/1974 | Dietze et al. | 148/189 |
| 3,948,695 | 4/1976 | Ryugo et al. | 148/189 |
| 3,956,023 | 5/1976 | Cline et al. | 148/171 X |

OTHER PUBLICATIONS

Kao, *Electrochemical Technology*, vol. 5, No. 3-4, Mar.-Apr. 1967, pp. 90-93.

*Primary Examiner*—G. Ozaki
*Attorney, Agent, or Firm*—Craig & Antonelli

[57] ABSTRACT

A process for the diffusion of aluminum into a semiconductor is disclosed. A piece of elemental aluminum used as a diffusion source is placed on a boat of a refractory metal and heated together with a semiconductor substrate in an evacuated sealed tube for diffusing aluminum into the semiconductor substrate. The semiconductor substrate having aluminum diffused therein is then subjected to heat treatment in an atmosphere of oxygen or nitrogen for a required length of time at a temperature higher than that used for the thermal diffusion. The above process provides the desired diffusion profile of aluminum, and a long lifetime of minority carriers in the substrate.

10 Claims, No Drawings

PROCESS FOR DIFFUSION OF ALUMINUM INTO A SEMICONDUCTOR

BACKGROUND OF THE INVENTION

This invention relates to a process for the diffusion of aluminum into a semiconductor.

A P-type conductivity region in a semiconductor substrate has commonly been formed by diffusing under heat an impurity element of the group IIIb in the periodic table, and boron and gallium have been principally employed for this purpose. However, from the viewpoint of the coefficient of diffusion of various impurity elements into a substrate of a semiconductor such as silicon, aluminum has a greatest coefficient of diffusion, and the use of aluminum as a dopant provides such advantages among others that the length of time required for the diffusion can be shortened, and a deep diffused layer having a low impurity concentration can be easily formed, compared with the use of boron or gallium as the dopant. With the recent tendency toward a larger power capacity and a higher reverse breakdown voltage in various semiconductor devices, there is an ever-increasing demand for the provision of a P-type diffused layer which is sufficiently deep and has a low impurity concentration. This is because the formation of a deep P-type diffused having a low impurity concentration in a semiconductor substrate provides such advantages among others that the carrier injection efficiency can be improved to reduce the on-state voltage, and the surface field strength can be reduced to improve the reverse breakdown voltage level. In order to obtain such a low-concentration deep P-type diffused layer, therefore, the importance of the diffusion of aluminum into a semiconductor substrate is increasing more and more.

However, the prior art aluminum diffusion process has been defective in that the lifetime of minority carriers in a semiconductor substrate having aluminum diffused therein tends to be shortened. This shortened lifetime of minority carriers will adversely affect the operating characteristics of the semiconductor device in that the reverse leakage current will increase and the forward voltage drop will also increase. It has therefore been difficult hitherto to apply the aluminum diffusion process to a semiconductor device which has a large power capacity and a high reverse breakdown voltage and for which an extended lifetime of minority carriers is demanded.

SUMMARY OF THE INVENTION

It is a primary object of the present invention to obviate the prior art defect pointed out above and to provide an improved process for the diffusion of aluminum into a semiconductor substrate so that the lifetime of minority carriers in the substrate can be extended, and the desired diffusion profile of aluminum can also be obtained within a relatively short period of time.

The process for the diffusion of aluminum into a semiconductor according to the present invention which attains the above object is featured by the fact that a piece of elemental aluminum used as a diffusion source is placed on a holder or boat of a refractory metal and heated together with a semiconductor substrate in an evacuated sealed tube for diffusing aluminum into the semiconductor substrate, and then, the semiconductor substrate having aluminum diffused therein is subjected to heat treatment for required length of time in an atmosphere of oxygen or nitrogen at a temperature higher than that used for the thermal diffusion.

DESCRIPTION OF THE PREFERRED EMBODIMENT

In an effort to provide an improved aluminum diffusion process for forming a low-concentration deep P-type diffused layer in a semiconductor substrate, the inventors have investigated in detail the effects of the factors including the diffusion system, the material of the boat carrying the aluminum diffusion source and the diffusion gas atmosphere on the lifetime of minority carriers in the semiconductor substrate having aluminum diffused therein. It is known that there are generally two processes for doping a semiconductor substrate with an impurity by diffusion under heat, that is, the open tube process in which a semiconductor substrate is placed in a gas stream including an impurity diffusion source thereby doping the semiconductor substrate with the impurity within the open tube, and the closed tube process in which both a semiconductor substrate and an impurity diffusion source are enclosed in an ampoule portion of a quartz tube for diffusing the impurity into the semiconductor substrate under heat. However, in the case of diffusion of aluminum under consideration, the latter process is exclusively adopted since the concentration of diffused aluminum fluctuates over a wide range in the former process. The closed tube process capable of providing a desired diffused impurity concentration is broadly classified into a first process in which the diffusion is carried out in a gas atmosphere enclosed in the closed tube, and a second process in which the step of diffusion in a vacuum is followed by the step of heat treatment at a high temperature. These two processes will now be discussed. In the first process, aluminum is diffused into a semiconductor substrate by a single step of heat treatment. In order to form a diffused layer of predetermined depth, it is necessary to make a heat treatment at a temperature of about 1,200° C. to 1,300° C. higher than the softening point (1,150° C. to 1,200° C.) of the quartz tube. Further, in order to prevent deformation of the quartz tube at that temperature under influence of the atmospheric pressure, an inert gas such as argon is enclosed in the quartz ampoule during the heat treatment.

In the second process, a semiconductor substrate and a diffusion source are enclosed under vacuum in the ampoule portion of the quartz tube, and heat treatment is carried out at a temperature lower than the softening point of the quartz tube thereby forming a diffused layer in the surface of the semiconductor substrate. According to this manner of heat treatment, a very long period of time, which may be as long as several days, is required for the diffusion of aluminum to the predetermined depth due to the low temperature of heat treatment. Therefore, after the heat treatment in the vacuum, the semiconductor substrate is taken out from the opened quartz ampoule and subjected to post heat treatment at a high temperature in a suitable gas atmosphere so as to ensure the diffusion of the impurity to the desired depth. Such a manner of aluminum diffusion into a semiconductor under vacuum is described in, for example, Y. C. Kao "On the Diffusion of Aluminum into Silicon" in ELECTROCHEMICAL TECHNOLOGY, Mar. Apr. 1967.

In the investigation of the aforementioned first process, elemental aluminum was used as the diffusion source, and silicon, quartz and alumina as well as a refractory metal such as tantalum were used as the material of the boat carrying the diffusion source. According to the results of measurement of the lifetime of minority carriers in the semiconductor substrate having aluminum diffused therein, the lifetime of minority carriers was so short or about 10 μs at the most in each of the above cases when aluminum was diffused at usual diffusion temperatures of 1,200° C. to 1,300° C. The results were similar to those above described even when an aluminum compound such as $Al_2O_3$ or AlN was used as the diffusion source. It was therefore found that the first process carrying out the heat treatment in the inert gas could not provide the desired extended lifetime of minority carriers.

In the investigation of the second process, elemental aluminum was used as the diffusion source in the step of diffusion under vacuum, and silicon, quartz and aluminum as well as refractory metals such as tantalum, niobium, tungsten and molybdenum were used as the material of the boat carrying the diffusion source. According to the results of the experiment, not only the desired concentration of diffused aluminum could not be obtained, but also the lifetime longer than 10 μs could not be obtained by heat treatment in whatever gas atmosphere after the diffusion in the vacuum, when the material of the boat was other than tantalum or like refractory metal and alumina, that is, when the material of the boat was silicon and quartz. The results were similar to those above described when an aluminum compound such as $Al_2O_3$ or AlN was used as the diffusion source. Further, when alumina was used as the material of the boat, the lifetime of minority carriers in the semiconductor substrate fluctuated over a wide range due to the presence of impurities in the alumina boat, resulting in impossibility of obtaining a stable and extended lifetime. In addition, implantation of these impurities into the quartz tube resulted in crystallization of quartz tending to destroy the quartz tube. Also, when alumina of high purity, for example, sapphire was used as the material of the boat, the surface of elemental aluminum was oxidized by reaction with oxygen contained in the alumina resulting in difficulty of diffusion of aluminum. Then, the lifetime of minority carriers in the semiconductor substrate was measured after the semiconductor substrate having aluminum diffused therein under vacuum by the use of the boat of the refractory metal such as tantalum was heat-treated in various gas atmospheres. The results of measurement proved that heat treatment in an atmosphere of oxygen or nitrogen could only provide the desired extended lifetime, and heat treatment in another gas atmosphere, for example, an argon gas atmosphere could only provide a very short lifetime of about several μs.

It will be seen from the above discussion that diffusion of aluminum to ensure an extended lifetime of minority carriers in a semiconductor substrate can be achieved by the process of the present invention in which elemental aluminum used as a diffusion source is placed on a holder or boat of a refractory metal and heated together with the semiconductor substrate in an evacuated sealed tube for diffusing aluminum into the semiconductor substrate, and the semiconductor substrate is then subjected to heat treatment for a required length of time in an oxygen or nitrogen atmosphere at a temperature higher than the temperature used for the thermal diffusion.

The extended lifetime may be obtained according to the process of the present invention for the reasons which will be described presently. Generally, the lifetime of minority carriers in a semiconductor substrate is shortened due to implantation of Au, Cu, Fe and like heavy metal impurities into the crystalline substrate from the substrate surface or from the gas atmosphere during the diffusion under heat, or due to, for example, defects produced in the crystal in the course of the diffusion under heat. In the first step of aluminum diffusion under vacuum in the process according to the present invention, the use of the boat of the refractory metal for carrying the aluminum source is effective in preventing an undesirable reduction in the lifetime of minority carriers since the heavy metal impurities giving rise to the reduction in the lifetime was supposed to be entirely taken into the refractory metal or an alloy of the refractory metal and aluminum without the chance of implanting into the semiconductor substrate. Further, the use of an argon or like inert gas atmosphere in the second step of heat treatment at a high temperature gives rise to vapor-phase etching of the substrate surface resulting in surface roughness. From the above fact, it is supposed that many defects are produced in the substrate surface and diffuse toward the interior of the semiconductor substrate resulting in the undesirable reduction of the lifetime of minority carriers in the semiconductor substrate. In the second step of the process according to the present invention, the semiconductor substrate is heat-treated in the oxygen or nitrogen atmosphere, so that an oxide film or a nitride film is formed on the substrate surface to prevent the undesirable reduction in the lifetime of minority carriers in the semiconductor substrate.

The first step of diffusion of aluminum under vacuum using the boat of refractory metal in the process according to the present invention continues for a length of time of from several hours to less than 20 hours at a temperature between 900° C. and 1,200° C. depending on the desired impurity concentration. When the degree of vacuum in the sealed tube is not sufficiently high; aluminum tends to be oxidized by oxygen remaining in the ampoule portion of the quartz tube, and it is difficult to ensure stable diffusion of aluminum without undesirable variations in the impurity concentration, diffused depth, etc. It is therefore desirable that the vacuum in the ampoule portion of the quartz tube be higher than at least $10^{-4}$ mm Hg, preferably, higher than $10^{-6}$ mm Hg. Further, when the amount of the aluminum source carried by the boat of refractory metal is too large, aluminum in grain form will deposit on the surface of the semiconductor substrate resulting in impossibility of the use of the semiconductor substrate for the manufacture of a semiconductor device. On the other hand, when the amount of the aluminum source is too small, the impurity concentration will not be uniform, and the lifetime of minority carriers will be shortened. It is therefore desirable that the amount of source aluminum be in the range of 0.5 mg to 5.0 mg per $cm^3$ of the volume of the quartz ampoule.

The desired diffusion profile of aluminum is not satisfactorily provided by the step of diffusion under vacuum. This step is therefore followed by the second step of heat treatment higher than the temperature used for the diffusion under vacuum. This temperature of heat treatment is selected to be between 1,200° C. and 1,300°

C. depending on the desired impurity concentration and depth of the diffused layer. The value of the lifetime of minority carriers in the semiconductor substrate after the heat treatment at such a high temperature is not dependent upon the temperature and duration of the heat treatment. Therefore, by suitably combining the conditions including the temperature and duration of the steps of diffusion under vacuum and heat treatment at the high temperature, any desired diffusion profile ensuring the desired extended lifetime of minority carriers can be achieved over a wide concentration range of $10^{14}$–$10^{18}$ atoms/cm$^3$.

A preferred embodiment of the process according to the present invention will now be described. Silicon wafers of N-type conductivity having an initial resistivity of about 200 Ωcm, a diameter of about 60 mm and a thickness of about 1,000 μm were used as the semiconductor substrate. A wire of aluminum having a purity of 99.999% was used as the diffusion source for the silicon wafers. Boats of tantalum, molybdenum and tungsten were used to carry the aluminum source individually, and the amount of the aluminum source carried by the boat was about 2 mg per cm$^2$ of the volume of the ampoule portion of the corresponding quartz tube. The boat carrying the aluminum source was placed together with the silicon wafers in the ampoule portion of the quartz tube and the quartz tube was sealed with a vacuum of $1 \times 10^{-6}$ mm Hg established therein. In the first step of diffusion under vacuum, the boat was heated in the sealed quartz ampoule for 10 hours at 1,080° C. to provide a diffusion depth of about 10μ to 20μ in the silicon wafers. The silicon wafers were then taken out from the opened quartz ampoule. In the second step of heat treatment, the silicon wafers were placed in an open quartz tube and heated for 25 hours at 1,250° C. while supplying oxygen and nitrogen at a flow rate of 1.0 l/min. After the second step, the diffusion depth in each of the silicon wafers was measured. The results of measurement proved that the diffusion depth was about 130μ in each of the silicon wafers, and a uniform diffused layer of aluminum having a maximum concentration of $1 \times 10^{17}$ atoms/cm$^3$ at a depth of about 30μ from the wafer surface was formed in each of the silicon wafers. The silicon wafers thus processed were used for the manufacture of diodes, and the lifetime of minority carriers in each of the diodes was measured. The following table shows the results of measurement:

| Boat | Heat treatment atmosphere | Lifetime (μs) |
|---|---|---|
| Tantalum | Oxygen | 72–110 |
|  | Nitrogen | 60–100 |
| Molybdenum | Oxygen | 50–70 |
|  | Nitrogen | 55–60 |
| Tungsten | Oxygen | 55–80 |
|  | Nitrogen | 50–70 |

It will be apparent from the above table that the lifetime of minority carriers in the diodes having aluminum diffused by the first and second steps of the process according to the present invention was longer than at least 50 μs.

It will be understood from the foregoing description that the aluminum diffused wafer having a remarkably extended lifetime of minority carriers can be obtained by the aluminum diffusion process according to the present invention. Therefore, semiconductor devices such as diodes, transistors and thyristors manufactured from the wafers processed by the process according to the present invention exhibit such excellent operating characteristics that the reverse leakage current is small, and the forward voltage drop is also small. It is an additional advantage of the present invention that the step of gettering with phosphorus or the like, which has heretofore been required for extending the lifetime of minority carriers in a semiconductor substrate after the step of diffusion of one of the impurities including aluminum, is now unnecessary, and the manufacturing process can be simplified correspondingly.

It is apparent that the present invention is in no way limited to the aforementioned example, and the marked effects of the present invention can be similarly exhibited when, for example, the material of the semiconductor substrate is germanium.

The material of the boat used in the process according to the present invention is in no way limited to the elemental refractory metal and may be an alloy of such a metal and aluminum. In this latter case, the boat itself acts as the diffusion source.

We claim:

1. A process for the diffusion of aluminum into a semiconductor comprising, in combination, the steps of:
   (a) subjecting a semiconductor substrate, made of a material selected from the group consisting of silicon and germanium, to a first heat treatment under vacuum to diffuse aluminum thereinto from an aluminum diffusion source carried by a holding means of a refractory metal disposed within an evacuated sealed tube; and
   (b) subjecting said semiconductor substrate to a second heat treatment in an atmosphere selected from the group consisting of oxygen and nitrogen at a temperature higher than that applied in said first step, whereby aluminum diffusion is achieved while substantially preventing reduction in the lifetime of minority carriers in the semiconductor substrate.

2. A process for the diffusion of aluminum into a semiconductor as claimed in claim 1, wherein the degree of vacuum used in said first step is higher than $10^{-4}$ mm Hg.

3. A process for the diffusion of aluminum into a semiconductor as claimed in claim 1, wherein the temperature of the first heat treatment in said first step is between 900° C. and 1,200° C., and the temperature of the second heat treatment is said second step is between 1,200° C. and 1,300° C.

4. A process for the diffusion of aluminum into a semiconductor as claimed in claim 1, wherein said holding means is made of a refractory metal selected from the group consisting of tantalum, niobium, molybdenum and tungsten.

5. A process for the diffusion of aluminum into a semiconductor as claimed in claim 1, wherein said holding means is made of an alloy of a refractory metal and aluminum and is used as the diffusion source.

6. A process for the diffusion of aluminum into a semiconductor as claimed in claim 1, wherein the amount of the aluminum diffusion source used in said first step is 0.5 mg–5.0 mg per cm$^3$ of the volume of the ampoule portion of the sealed tube.

7. A process for the diffusion of aluminum into a semiconductor as claimed in claim 2, wherein said degree of vacuum is higher than $10^{-6}$ mm Hg.

8. A process for the diffusion of aluminum into a semiconductor as claimed in claim 1, wherein the semiconductor substrate is made of silicon.

9. A process for the diffusion of aluminum into a semiconductor as claimed in claim 1, wherein said semiconductor substrate is subjected to said second heat treatment such that an oxide or a nitride, respectively, is formed on the semiconductor substrate surface.

10. A process for the diffusion of aluminum into a semiconductor as claimed in claim 1, wherein said holding means is a boat.

* * * * *